United States Patent [19]
Lamarche et al.

[11] Patent Number: 5,825,233
[45] Date of Patent: Oct. 20, 1998

[54] ELECTRONIC PROXIMITY SWITCHING DEVICE

[75] Inventors: Jean-Luc Lamarche, Mittelhausbergen, France; Guntram Rundel, Baienfurt, Germany

[73] Assignee: i f m electronic gmbh, Essen, Germany

[21] Appl. No.: 649,267

[22] Filed: May 17, 1996

[30] Foreign Application Priority Data

May 18, 1995 [DE] Germany .................. 195 17 936.6

[51] Int. Cl.$^6$ ...................................................... H03K 5/01
[52] U.S. Cl. .......................................... 327/365; 327/368
[58] Field of Search ..................... 327/365, 368; 307/116, 117

[56] References Cited

U.S. PATENT DOCUMENTS

| | | | |
|---|---|---|---|
| 3,832,570 | 8/1974 | Gabus ...................................... | 307/116 |
| 4,551,637 | 11/1985 | Buck et al. ............................... | 327/509 |
| 4,672,230 | 6/1987 | Spähn ....................................... | 307/116 |
| 4,745,300 | 5/1988 | Krammerer et al. .................... | 307/112 |
| 5,068,592 | 11/1991 | Leonard et al. ......................... | 323/224 |

FOREIGN PATENT DOCUMENTS

| | | |
|---|---|---|
| 33 21 838 | 7/1989 | Germany . |
| WO 94/23499 | 10/1994 | WIPO . |

Primary Examiner—David C. Nelms
Assistant Examiner—Hoai Ho
Attorney, Agent, or Firm—Sixbey, Friedman, Leedom & Ferguson; David S. Safran

[57] ABSTRACT

An electronic switching device which can be connected via an outside conductor to one pole of a voltage source and only via one other outside conductor to a terminal of a consumer, in which the other terminal of the consumer can be connected to the other pole of the voltage source, therefore a two-wire switching device, with a proximity indicator (1) which can be influenced from the outside, with an electronic switch (3), which can be controlled by the proximity indicator (1) via a switching amplifier (2), and with operating voltage supply circuit (4) for making available the operating voltage required by proximity indicator (1), and optionally by the switching amplifier (2) (=internal operating voltage), the operating voltage supply circuit (4) an having in-phase regulator (5) and proximity indicator (1) and the switching amplifier (2) being connected to the output of the in-phase regulator (5). While in the two-wire switching devices known from the prior art two power components are necessary, in the electronic switching device according to the invention only one power component is necessary, because the operating voltage supply circuit (4) has a shunt controller (6) in addition to the in-phase regulator (5). The input of the shunt controller (6) is connected to the output of in-phase regulator (5), the actuator (7) of shunt controller (6) is in series with electronic switch (3), and the proximity indicator (1) and switching amplifier (6) are also connected to the connection of actuator (7) of shunt controller (6) to electronic switch (3).

21 Claims, 4 Drawing Sheets

ELECTRONIC PROXIMITY SWITCHING DEVICE

BACKGROUND OF THE INVENTION

1. Field of the Invention

The invention relates to an electronic, preferably proximity switching device, especially an inductive, capacitive or optoelectronic proximity switch or a flow monitor which can be connected via an outside conductor to one pole of a voltage source and only via one other outside conductor to a terminal of a consumer, in which the other terminal of the consumer can be connected to the other pole of the voltage source, with a proximity indicator which can be influenced from the outside, for example, an oscillator, with an electronic switch, for example, a transistor, thyristor or Triac, which can be controlled by the proximity indicator—optionally via a switching amplifier—and with an operating voltage supply circuit for making available the operating voltage required by the proximity indicator and optionally by the switching amplifier (= internal operating voltage), the operating voltage supply circuit having an in-phase regulator and the proximity indicator and optionally the switching amplifier being connected to the output of the in-phase regulator.

2. Description of Related Art

Electronic switching devices of the aforementioned type are made solid-state and have been used for more than twenty years, increasingly in place of electrical, mechanically actuated switching devices which are made with contacts, especially in electrical or electronic measurement, open loop and closed loop control circuits. This applies especially to proximity switches, i.e. electronic switching devices which operate without contact. It is indicated with these switching devices whether an influencing element to which the corresponding proximity switch is sensitive has approached the proximity switch to a sufficient degree. When an influencing element to which the corresponding proximity switch is sensitive has approached the proximity switch closely enough, the proximity indicator reverses the electronic switch. In a switching device executed to make contact, the electronic switch which was first nonconductive becomes conductive, while in the switching device executed to break contact, the electronic switch which was first conductive now blocks conduction. Switching devices of this type can also be used to indicate whether a physical quantity of an influencing medium to which the switching device is sensitive has reached a corresponding value.

An important component of electronic switching devices of the type under consideration is, therefore, among others, the proximity indicator which can be influenced from the outside. Generally, in inductive or capacitive proximity switches, an oscillator which can be inductively influenced or an oscillator which can be capacitively influenced is provided as the proximity indicator. Optoelectronic proximity switches used as a proximity indicator have a photoresistor, a photodiode or a phototransistor. In addition, so-called flow monitors which have a temperature measurement circuit are also included among electronic switching devices to which the teaching of the invention relates.

In inductive proximity switches, $K \times V - 1$ applies to the oscillator as long as a metal part has not yet reached a stipulated distance, i.e., the oscillator oscillates, wherein K is the feedback factor and V is the gain of the oscillator. When the corresponding metal part reaches the stipulated distance, the increasing damping of the oscillator leads to a reduction of the gain V, i.e. the amplitude of the oscillator oscillation drops back or the oscillator ceases oscillating. In capacitive proximity switches, $K \times V < 1$, applies to the oscillator as long as a response body has not yet reached the capacitance between a response electrode and a counterelectrode, i.e. the oscillator does not oscillate. When the response body reaches the stipulated distance, the increasing capacitance between the response electrode and the counterelectrode leads to an increase of the feedback factor K, so that $K \times V = 1$, i.e. the oscillator begins to oscillate. In both embodiments, the inductive proximity switch and capacitive proximity switch, depending on the different states of the oscillator, the electronic switch is generally controlled via a switching amplifier.

Optoelectronic proximity switches, also known as photoelectric barriers, have an opto-transmitter and opto-receiver. These switches are distinguished between a first type of photoelectric barrier in which the opto-transmitter and opto-receiver are located on opposite sides of a monitored section, and a second type of photoelectric barrier in which the opto-transmitter and opto-receiver are located on the same end of a monitored section, while a reflector located on the other end of the monitored section reflects the light beam emerging from the opto-transmitter back to the opto-receiver. In both cases, the proximity indicator responds when the light beam which normally travels from the opto-transmitter to the opto-receiver is interrupted by an influencing element which has moved into the monitored section. However, there are also photoelectric barriers of the latter described type in which the light beam emitted from the opto-transmitter is reflected back only by a corresponding influencing element to the opto-receiver.

In electronic switching devices which can be connected via an outside conductor to one pole of a voltage source and only via another outside conductor to one terminal of a consumer, it is not a problem to make available the operating voltage, the internal operating voltage, or the operating current required by the proximity indicator and, optionally, the switching amplifier, because the internal operating voltage or the operating current must be made available both in the conducting state and also the blocked state of the switching device.

It is irrelevant whether it is a matter of making available an internal operating voltage or operating current, because the proximity indicator and optionally the switching amplifier of course require electric power. Therefore, both an internal operating voltage as well as an operating current are required.

Based on their function as switching devices, essentially no voltage drop will occur in the switching devices of the present invention in the conductive state and essentially no residual current will flow in the blocked state. But when, in two-wire switching devices of the type of the present invention, no voltage drop would occur in the conductive state, neither could any internal operating voltage be obtained for the proximity indicator and optionally the switching amplifier, and when in the blocked state no residual current would flow, nor could any operating current be obtained. Therefore, it applies to all electronic switching devices with only two outside conductors that in the conductive state a voltage drop occurs and in the blocked state a residual current flows.

It follows from the aforementioned that when a voltage drop occurs in the conductive state and a residual current flows in the blocked state, even unintentionally, but necessarily, for operation of the electronic switching devices under consideration here, the voltage drop and the residual current should be a low as possible.

In electronic switching devices of the type under consideration, it has already been recognized that the voltage drop in the conductive state of the switching device can be further reduced if the operating voltage supply circuit, which provides the operating voltage required by the proximity indicator and optionally the switching amplifier, also referred to as the internal operating voltage, is provided with a DC/DC converter. With one such DC/DC converter in the secondary circuit, a higher converter voltage can be obtained than in the primary circuit. Consequently, the voltage drop in the conductive state of the switching device can be less than the required internal operating voltage.

Incidentally, electronic switching devices of the type under consideration are known in which the controllable electronic circuit requires a relatively high control voltage. This applies especially when, as an electronic switch, there is a MOS-FET power transistor, which, depending on the load current flowing via the MOSFET power transistor, requires a gate voltage of roughly 4–6 V.

Especially in two-wire electronic switching devices of the type of the present invention, which are designed for a relatively high external operating voltage or in any case which are suitable, for example, for an external operating voltage of 230 V, a currently conventional line voltage, the requirements for the components to be used which result: a) from the voltage which occurs on the component, b) from the current flowing through the component, and c) from the power converted in the component, must be watched.

In the following, those components on which the external operating voltage should arise will be called voltage-stable components, those components via which the external operating current is designed to flow will be called current-stable components, and those components in which considerable power should be converted will be called power components.

The internal operating voltage or the voltage drop on the switching device must be distinguished from the external operating voltage which can be, for example, 230 V. The voltage drop on the switching device is ideally the same as the internal operating voltage, but is of course in fact always somewhat larger than the internal operating voltage. The external operating current, i.e., the current flowing in the conductive state of the switching device via the latter must also be distinguished from the internal operating current or the residual current which in flows via the switching device when it is in the blocked state.

The power which is converted in the individual components can result: a) from the external operating voltage and the internal operating current or the residual current via the switching device, or b) from the internal operating voltage or the voltage drop on the switching device and the external operating current. Components in which powers according to a) or b) result are power components.

The two-wire switching devices known in the prior art for relatively high external operating voltages are relatively expensive at present, insofar as at least two power components at a time are necessary in them.

In a switching device disclosed in U.S. Pat. No. 4,551,637, the in-phase regulator which belongs to the operating voltage supply circuit is executed as a current controller, specifically as a so-called constant current generator. The transistor which belongs to the in-phase regulator, called a generator transistor, is a voltage-stable power component. In addition, a Zener diode belongs to the operating voltage supply circuit, wherein the Zener diode is a current-stable power component.

German patent 32 21 838 discloses an electronic switching device with a power MOS-FET and Zener diode which belong to its operating voltage supply circuit. The power MOS-FET is a voltage-stable power component, and the Zener diode is a current-stable power component.

The in-phase regulator provided in electronic switching devices known in the prior art and also in the switching device according to the present invention as part of the operating voltage supply circuit is normally designed to supply the proximity indicator, and optionally the switching amplifier, with the necessary electric power. Consequently, the in-phase regulator can be a voltage regulator or current regulator. If the in-phase regulator is a voltage regulator, it provides for only the necessary internal operating voltage on the proximity indicator and optionally on the switching amplifier, where the difference between the external operating voltage (with the switching device blocked) or the voltage drop on the switching device (when the switching device is conductive), on the one hand, and the internal operating voltage, on the other, drops out on the in-phase regulator. If the in-phase regulator is a current regulator, this provides for a more or less constant internal operating current to be flowing, regardless of the magnitude of the external operating voltage.

Often electronic switching devices are built such that in the different states, switching device blocked or switching device conductive, the internal operating voltage or the internal operating current is obtained differently. Specifically, with the switching device blocked, the internal operating current is obtained via the in-phase regulator. Conversely, with the switching device conductive, the current is obtained from the external operating current which flows via the switching device, therefore from the load current. However, in the prior art, there are also switching devices in which the internal operating voltage or the internal operating current is obtained in both states of the switching device using the inphase regulator.

It has already been detailed above that, in the conductive state of the switching device, the voltage drop on it is ideally equal to the internal operating voltage, but in fact it is always somewhat greater than the internal operating voltage. In any case the difference between the voltage drop on the switching device and the internal operating voltage is low, so that the in-phase regulator is essentially "switched through". This of course applies only in those switching devices in which in the conductive state the internal operating voltage and the internal operating current are also made available via the in-phase regulator.

SUMMARY OF THE INVENTION

The primary object of the present invention is to devise an electronic switching device of the initially described type, therefore a two-wire switching device, for relatively high external operating voltages, which is less expensive than known switching devices with respect to the components which can be used.

The electronic switching device according to the present invention in which the object described above is achieved is, first of all, essentially characterized in that the operating voltage supply circuit, in addition to the in-phase regulator, has a shunt controller. The input of the shunt controller is connected to the output of the in-phase regulator. The actuator of the shunt controller is in series with the electronic switch, and the proximity indicator and, optionally, the switching amplifier are also connected to the connection of the actuator of the shunt controller to the electronic switch. This will now be explained hereinafter in greater detail.

The operating voltage supply circuit of the switching device according to the present invention now includes a shunt controller in addition to the in-phase regulator explained above. In this case, a shunt controller is a circuit which, using its actuator which is in series with the electronic switch, provides for the required internal operating voltage being available in the blocked state of the switching device in conjunction with the in-phase regulator and at least most of the internal operating current flowing via the actuator into the proximity indicator, and optionally, the switching amplifier.

It now applies to the switching device according to the present invention that, in the blocked state, the in-phase regulator operates essentially atypically, specifically only a small part of the operating current flows via the in-phase regulator, with most of the operating current flowing via the actuator of the shunt controller. In contrast, in the conductive state of the switching device, the internal operating current, as a small part of the external operating current and therefore the load current, flows via the in-phase regulator. Thus the following requirements for the components to be used arise: a) an electronic switch which is a current-stable component but need not be voltage-stable and need not be a power component; b) an in-phase regulator (or electronic component attached to it), which is a voltage-stable component but need not be current-stable and need not be a power component; and c) a shunt controller (or electronic component attached to the shunt controller serving as an actuator), which is a voltage- and current-stable power component. Therefore, only one power component is required.

The electronic switch requires no power component, because most of the load current flows via the electronic switch in the conductive state of the switching device, and the voltage drop which occurs however is minimal so that, as the product of current and voltage, significant power is not converted in the electronic switch.

For the in-phase regulator or for the electronic component attached to it the following applies: In the blocked state of the switching device there is an external operating voltage, however only a very small current, specifically only a small part of the internal operating current which is the residual current, flows via the in-phase regulator. In the conductive state of the switching device, the entire internal operating current flows as part of the load current via the in-phase regulator; however, the voltage on the in-phase regulator is low. In both cases, therefore, the power converted in the in-phase regulator or in the component attached to it is low.

For the shunt controller or for the electronic component serving as the actuator for the shunt controller, the following applies: In the blocked state of the switching device there is external operating voltage and most of the internal operating current, therefore most of the residual current, flows via the actuator of the shunt controller. Therefore considerable power is converted so that a power component is needed. In the conductive state of the switching device there is only the voltage drop of the switching device, however most of the external operating current, therefore the load current, flows via the component under consideration here. Therefore significant power is also converted in this state.

It is detailed above that a power component is needed when a) the external operating voltage is present and the internal operating current or residual current flows, or b) only the internal operating voltage or the voltage drop of the switching device is present, but the external operating current, therefore the load current, at least most of it, flows via the component. In the prior art, a first power component is needed for case a) and a second power component for case b). Therefore, the main object of the present invention consists in is that the same power component may be used for case a) and for case b), and therefore only one power component is needed.

In particular, there are now various possibilities for embodying and developing the electronic switching device according to the present invention. This applies especially with respect to implementation of the in-phase regulator, the shunt controller and the actuator of the shunt controller, but mainly also with respect to the specific implementation of the measures which lead to the fact that, as detailed above, in the switching device according to the invention on the one hand in the blocked state only a small part of the operating current flows via the in-phase regulator and most of the operating current therefore flows via the actuator of the shunt controller, while in the conductive state the internal operating current, as a small part of the external operating current, and therefore of the load current, flows via the in-phase regulator.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

FIGS. 1–4 show partial block-schematic diagrams of the switching devices which are solid-state. In particular, the switching devices can be inductive, capacitive or optoelectronic proximity switches or flow monitors. They can be connected via an external conductor (not shown) to a pole of a voltage source (not shown) and only via another external conductor (not shown) to a terminal of a consumer (not shown), in which the other terminal of the consumer can be connected to the other pole of the voltage source. Therefore, the present invention is directed essentially to two-wire switching devices.

Figure 1:
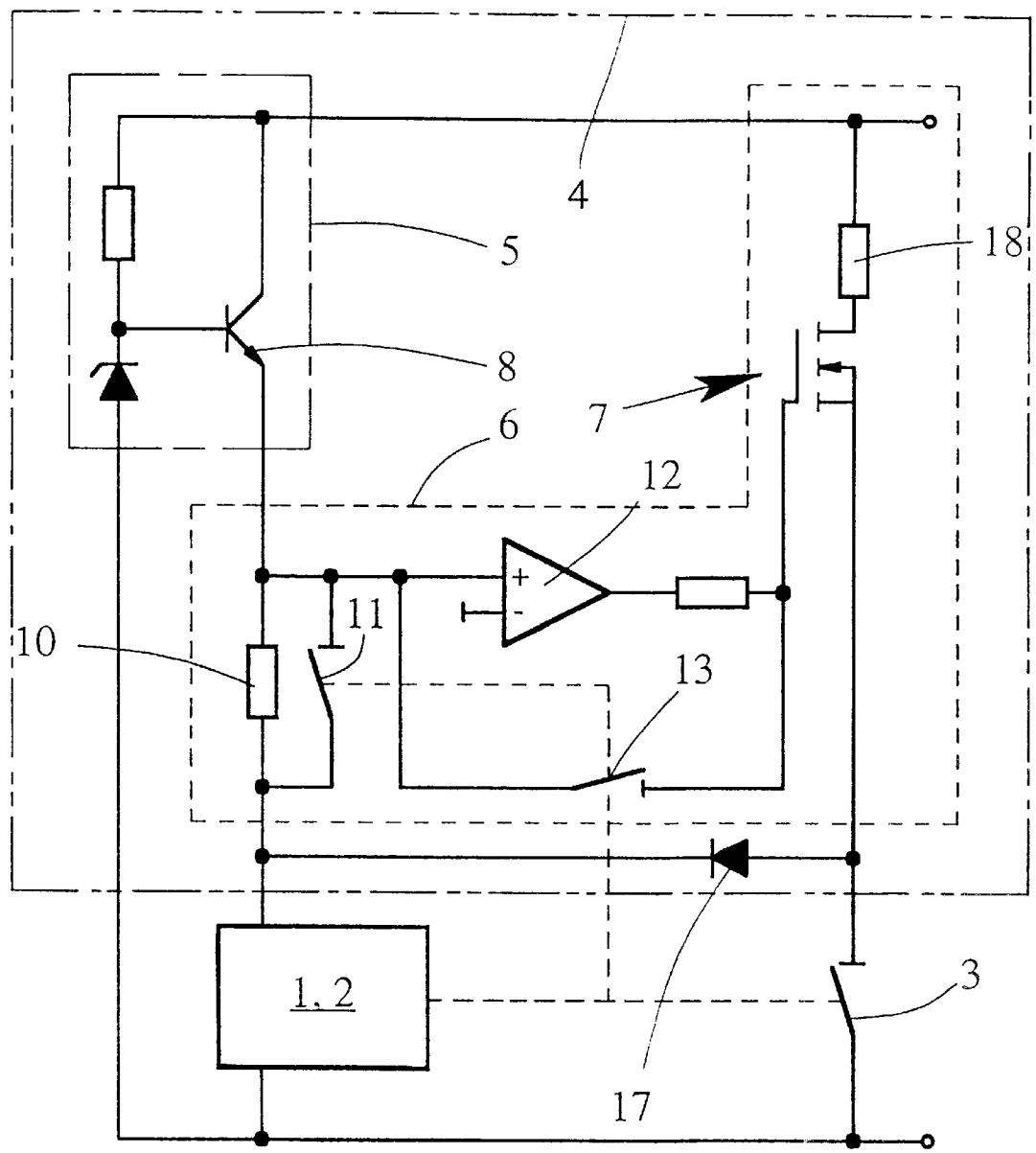
FIG. 1 is a partial block-schematic diagram of an electronic switching device according to the present invention.

The switching devices shown include only one proximity indicator 1 which is shown in FIG. 1 and which can be influenced from the outside. The indicator 1 may include, for example, an oscillator, in combination with a switching amplifier 2, shown in FIG. 1, which control an electronic switch 3. Electronic switch 3 is shown only schematically in the embodiment according to FIG. 1, and in the embodiments according to FIGS. 2, 3 and 4, electronic switch 3 is shown as a single npn transistor.

The electronic switching devices of the present invention, then, further include an operating voltage supply circuit 4 for providing the operating voltage required by proximity indicator 1 and switching amplifier 2, i.e. the internal operating voltage. Operating voltage supply circuit 4 has an in-phase regulator 5, wherein proximity indicator 1 and switching amplifier 2 are connected to the output of in-phase regulator 5.

As the figures show, operating voltage supply circuit 4, in addition to the in-phase regulator, has a shunt controller 6. The input of shunt controller 6 is connected to the output of in-phase regulator 5. Shunt controller 6 includes an actuator 7 which is connected in series with the electronic switch 3. Proximity indicator 1 and switching amplifier 2 are, as already detailed, connected to the output of in-phase regulator 5, while also being connected to the actuator 7 of shunt controller 6 to electronic switch 3. "Connected" means that proximity indicator 1 and switching amplifier 2 receive the internal operating voltage and internal operating current through this connection.

Operating voltage supply circuit 4 includes, besides in-phase regulator 5, shunt controller 6. Shunt controller 6, using its actuator 7, which is in series with electronic switch 3, provides the required internal operating voltage, being available in the blocked state of the switching device, in conjunction with in-phase regulator 5, and at least most of the internal operating current flowing via actuator 7 into proximity indicator 1 and switching amplifier 2. In the blocked state of the switching device according to the present invention, the in-phase regulator 5 operates essentially atypically, specifically only a small part of the operating current flows via in-phase regulator 5, while most of the operating current flows via actuator 7 of shunt controller 6. In contrast, in the conductive state of the switching device, the internal operating current, as a small part of the external operating current, and therefore of the load current, flows via in-phase regulator 5.

In the embodiment according to FIG. 1, in-phase regulator 5 has a bipolar transistor, specifically a npn transistor 8. In contrast, in-phase regulator 5, in the embodiments according to FIGS. 2, 3 and 4, has a field effect transistor, specifically an n-channel depletion MOS-FET 9. In all embodiments, there is a current limiting resistor 10 positioned between in-phase regulator 5 and proximity indicator 1 and switching amplifier 2. Electronic bridging switch 11, which can be triggered by proximity indicator 1 or switching amplifier 2, is connected parallel to current limiting resistor 10.

In the embodiment according to FIG. 1, shunt controller 6 has an operational amplifier 12 on the input side. Electronic bridging switch 13, which can be triggered by proximity indicator 1 or switching amplifier 2, is connected parallel to the operational amplifier 12. Instead of operational amplifier 12 in the embodiment according to FIG. 1, in the embodiment according to FIG. 2 there is difference amplifier 14. In the embodiments according to FIGS. 3 & 4, normal amplifiers 15 are provided instead of operational amplifier 12. In the embodiments according to FIGS. 2, 3 and 4, the shunt controller 6 includes a control transistor 16 which is functionally comparable to electronic bridging switch 13 in the embodiment according to FIG. 1.

With regard to the actuator 7 of shunt controller 6, the figures show that different devices may be used as the actuator 7 in the different embodiments. In the embodiments according to FIGS. 1, 3 and 4, a field effect transistor serves as the actuator 7 of shunt controller 6, specifically an n-channel enhancement MOS-FET. In contrast, in the embodiment according to FIG. 2, an npn transistor serves as the actuator 7 of shunt controller 6, wherein the npn transistor could also be replaced by a Darlington circuit of npn transistors.

Incidentally, it still applies to all of the electronic switching devices shown in the FIGS. 1–4 that between the connection of actuator 7 of shunt controller 6 and electronic switch 3 on one side, and proximity indicator 1 and switching amplifier 2, on the other side, is a control diode 17 which is connected in the conducting direction. A relief resistor 18 is positioned in series with actuator 7 of shunt controller 6.

Figure 2:
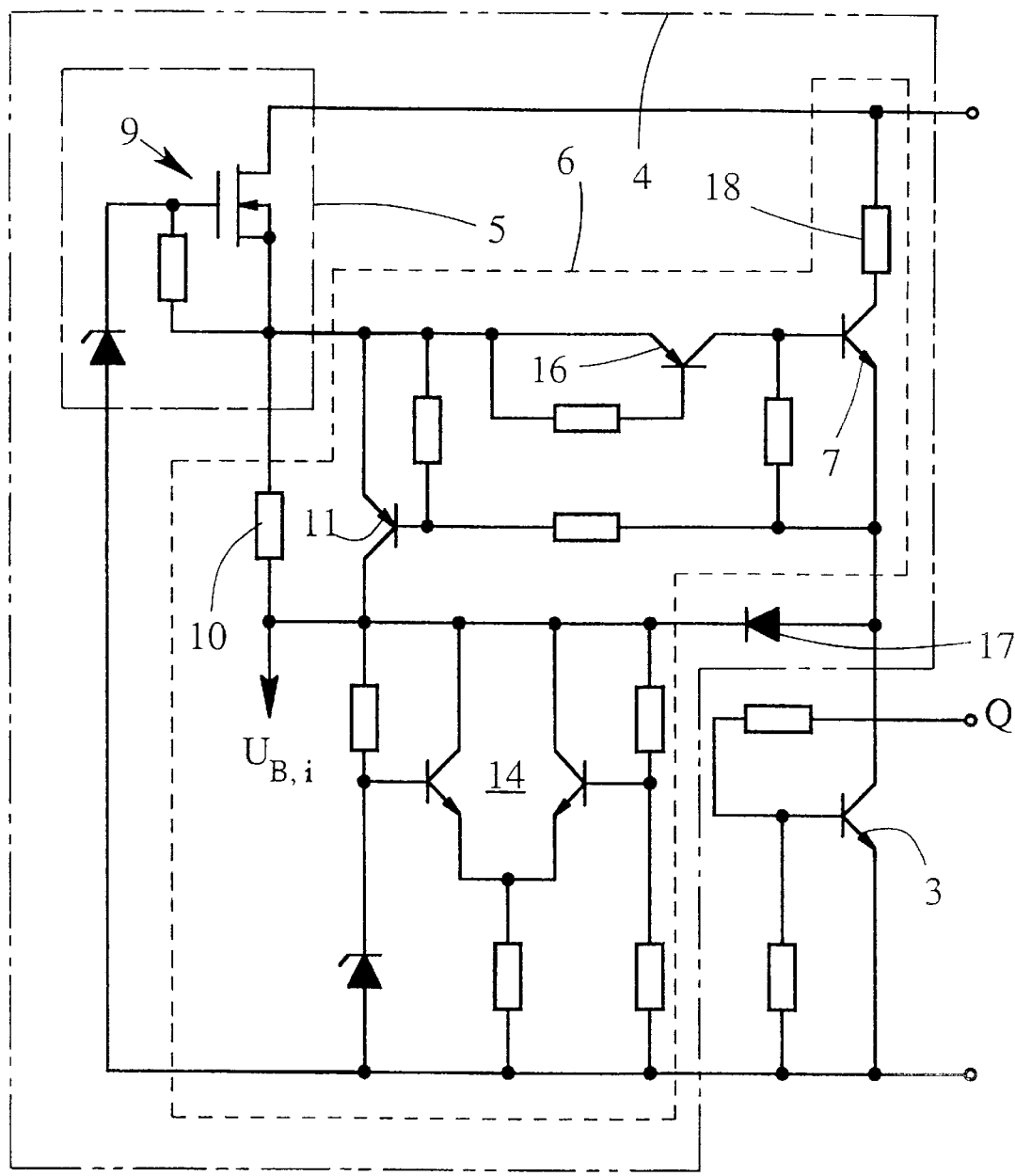
FIG. 2 is a partial block-schematic diagram of a second embodiment of the electronic switching device according to the present invention.
Figure 3:
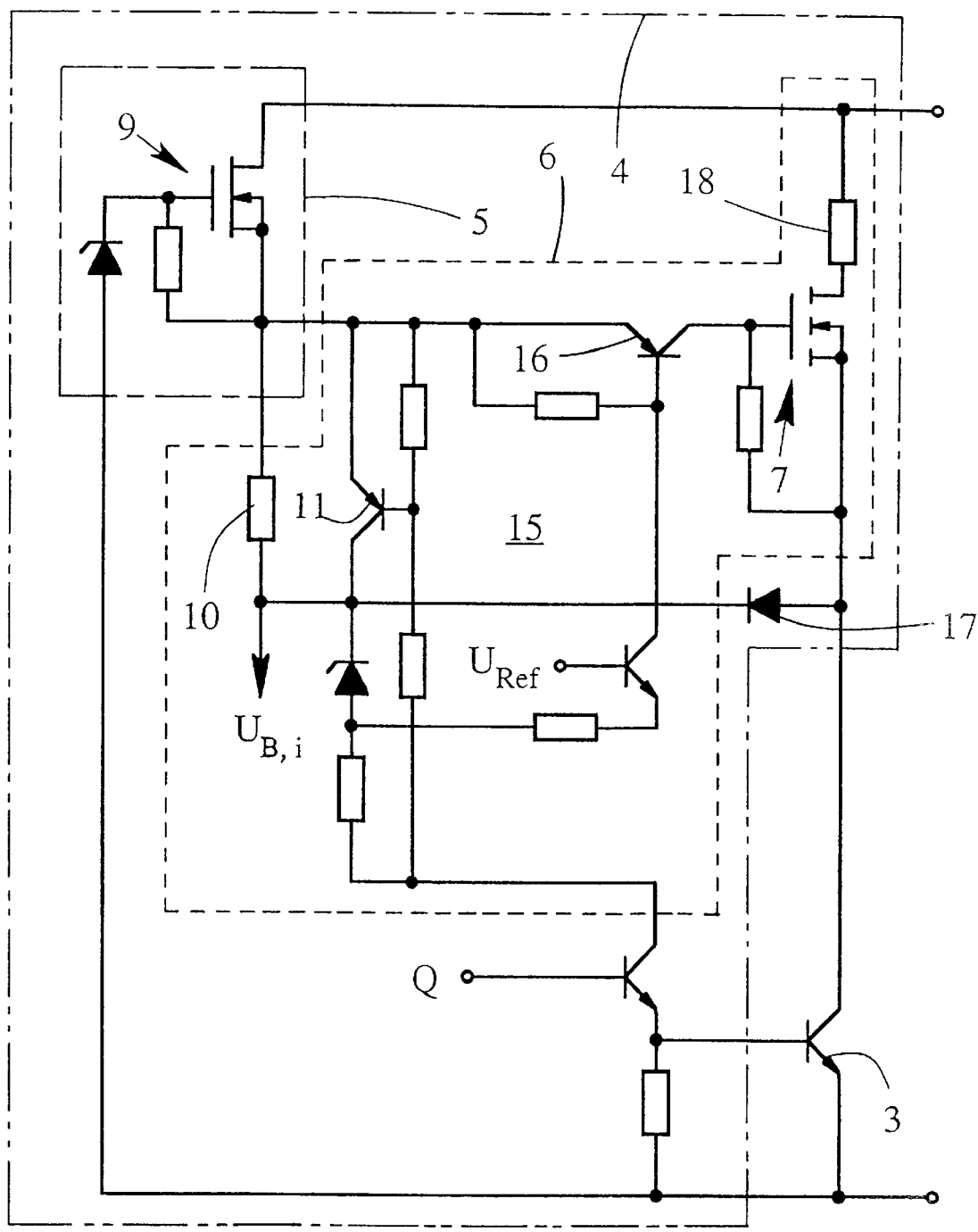
FIG. 3 is a partial block-schematic diagram of a third embodiment of the electronic switching device according to the present invention.
Figure 4:
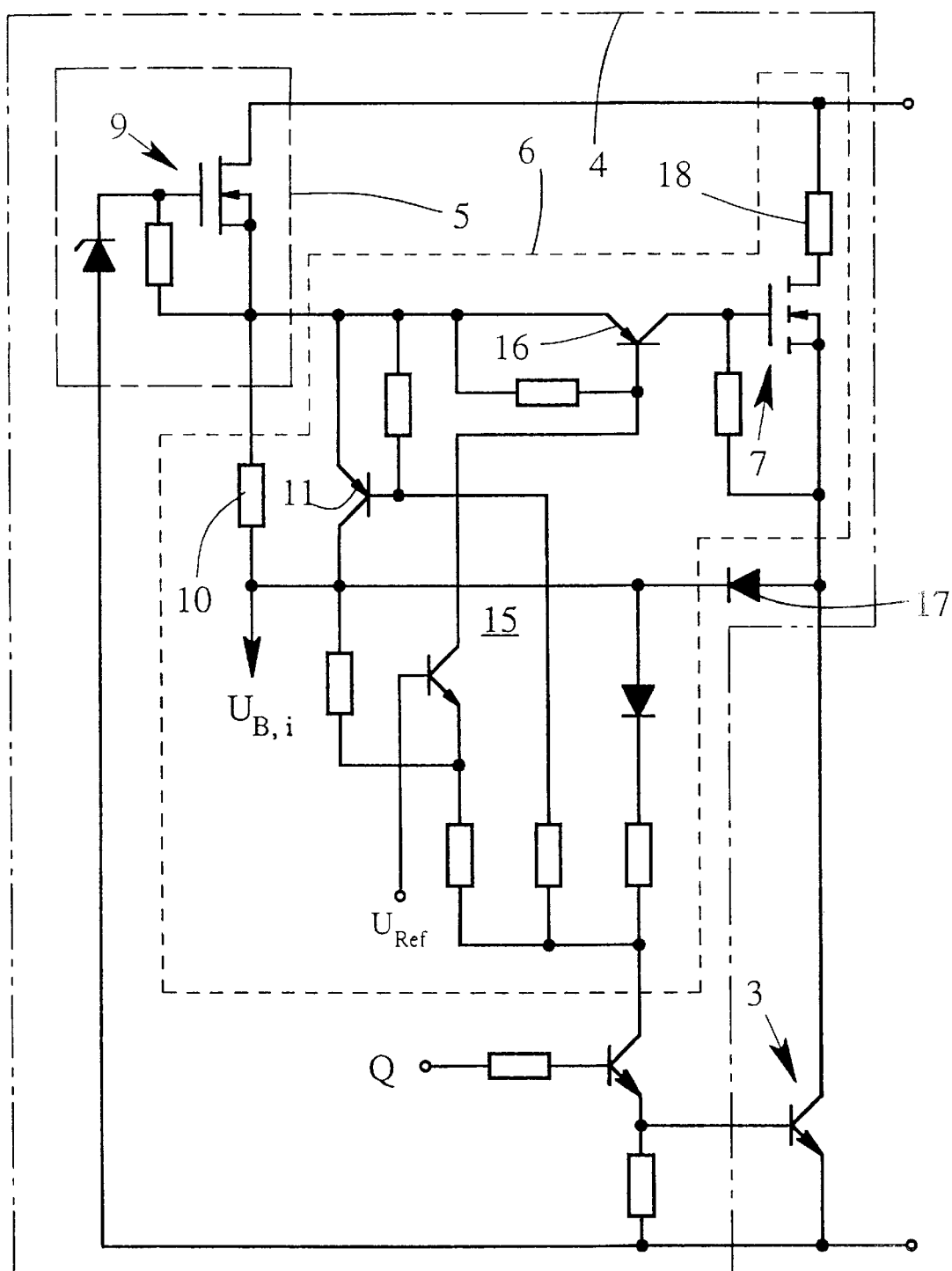
FIG. 4 is a partial block-schematic diagram of a fourth embodiment of the electronic switching device according to the present invention.

It has already been stated above that only in FIG. 1 is it indicated that the electronic switching device under consideration includes a proximity indicator 1 which can be influenced from the outside, and switching amplifier 2. Proximity indicator 1 and switching amplifier 2 control electronic switch 3 and electronic bridging switches 11 and 13, where this is indicated in FIG. 1 by broken lines. In FIG. 1 electronic switch 3 is only shown schematically, and the same applies to bridging switches 11 and 13. In FIGS. 2, 3 and 4 the proximity indicator and switching amplifier are not shown. In FIGS. 2–4, it is shown instead where the internal operating voltage, labeled $U_B$, is available to the proximity indicator and switching amplifier. Since in FIGS. 2, 3 and 4 the proximity indicator and switching amplifier are not shown, it is indicated in these figures where the output signal of the switching amplifier, labelled Q, is supplied. Incidentally, it is shown in FIGS. 2, 3 and 4 that electronic bridging switch 11 is executed as a pnp-transistor.

In the following, how the electronic switching device according to the invention works will be explained using the embodiment according to FIG. 1. First of all, it is assumed that the switching device is in the blocked state, where electronic switch 3 is blocked, bridging switch 11 is blocked and bridging switch 13 is conductive. Actuator 7 of shunt controller 6 is triggered via the output of in-phase regulator 5 and conductive bridging switch 13. In-phase regulator 5 operates atypically. Only a small part of the operating current for proximity indicator 1 and switching amplifier 2 flows via in-phase regulator 5, and this results from the fact that, due to blocked bridging switch 11, current limiting resistor 10 is active between the output of in-phase regulator 5, on the one side, and proximity indicator 1 and switching amplifier 2, on the other side. Most of the operating current flows via actuator 7 of shunt controller 6 and control diode 17 to proximity indicator 1 and to switching amplifier 2.

Now, when the switching device is in the conductive state, then electronic switch 3 is conductive, bridging switch 11 is conductive and bridging switch 13 is blocked. Now, the entire operating current, as a small part of the external operating current, and therefore of the load current, flows via in-phase regulator 5 and conductive bridging switch 11 to proximity indicator 1 and switching amplifier 2. No current can flow from actuator 7 of shunt controller 6 to proximity indicator 1 and switching amplifier 2 because control diode 17 is now blocking. The potential on the anode of control diode 17 is negative compared to the potential on the cathode of control diode 17 since the anode of control diode 17 is essentially at ground potential via conductive electronic switch 3.

It has been explained above that, in the electronic switching device according to the present invention, only one voltage-stable and current-stable power component is needed, that is, for actuator 7 of shunt controller 6. Therefore, the resulting power loss in actuator 7 of shunt controller 6 is easily converted. In all the embodiments of the electronic switching device according to the present invention, the relief resistor 18 is positioned in series with actuator 7 of shunt controller 6. This allows some of the power loss, which necessarily occurs, to occur in relief resistor 18, and actuator 7 of shunt controller 6 must therefore accept only part of the power loss.

The embodiments of the switching devices according to the invention which are shown in FIG. 2, 3 and 4 require no further special explanation. As already detailed, the embodiments according to FIGS. 2, 3 and 4 differ from the embodiment according to FIG. 1 essentially by the specific implementation of shunt controller 6. While in the embodiment according to FIG. 1 shunt controller 6 includes operational amplifier 12 and bridging switch 13, in the embodiment according to FIG. 2 there is difference amplifier 14, and in the embodiment according to FIGS. 3 and 4 there is normal amplifier 15. Control transistor 16 in the embodiments according to FIGS. 2, 3 and 4 corresponds to bridging switch 13 in the embodiment according to FIG. 1. Incidentally, how shunt controller 6 works in the embodiments of FIGS. 2, 3 and 4 is easily apparent to one skilled in the art from the specific circuits shown. The teaching of the invention also includes the specific circuits of the shunt controller shown in FIGS. 2, 3 and 4, i.e., the specifically used components and the interconnections of the components used which follow from FIG. 2, 3 and 4.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We Claim:

1. An electronic proximity switching device having only two outside conductors, the switching device being connectable through a first of said outside conductors to one pole of a voltage source and through the second of said two outside conductors to a terminal of a consumer, and in which the other terminal of the consumer can be connected to a second pole of the voltage source, comprising:

switching means which can be externally influenced;

an electronic switch which can be controlled by said switching means;

an operating voltage supply circuit for providing an operating voltage required by said switching means; said operating voltage supply circuit including an in-phase regulator having an output and a shunt controller having an input; said switching means being connected to the output of said in-phase regulator; and said shunt controller including an actuator and the input of said shunt controller being connected to the output of said in-phase regulator; wherein said actuator of said shunt controller is connected in series with the electronic switch; and wherein the switching means is also connected to the connection of said actuator of said shunt controller to said electronic switch.

2. The electronic proximity switching device according to claim 1, wherein said switching means comprises a proximity indicator.

3. The electronic proximity switching device according to claim 2, wherein said electronic switch is controlled by said proximity indicator through a switching amplifier.

4. The electronic proximity switching device according to claim 1, wherein said in-phase regulator includes a bipolar transistor.

5. The electronic proximity switching device according to claim 4, wherein said bipolar transistor is a npn transistor.

6. The electronic proximity switching device according to claim 5, wherein said bipolar transistor is a field effect transistor.

7. The electronic proximity switching device according to claim 6, wherein said field effect transistor is an n-channel depletion MOS-FET.

8. The electronic proximity switching device according to claim 1, further including a current limiting resistor positioned between said in-phase regulator and said switching means.

9. The electronic proximity switching device according to claim 8, further including a electronic bridging switch connected parallel to said current limiting resistor; wherein said electronic bridging switch is triggerable by said switching means.

10. The electronic proximity switching device according to claim 1, wherein said shunt controller has one of a operational amplifier and a difference amplifier connected thereto on an input side.

11. The electronic proximity switching device according to claim 9, wherein said shunt controller has an operational amplifier connected thereto on an input side.

12. The electronic proximity switching device according to claim 9, wherein said shunt controller has a difference amplifier connected thereto on an input side.

13. The electronic proximity switching device according to claim 11, wherein said electronic bridging switch is connected parallel to said operational amplifier.

14. The electronic proximity switching device according to claim 1, wherein said shunt controller includes a control transistor; and wherein said control transitor triggerable by said switching means.

15. The electronic proximity switching device according to claim 1, wherein said actuator of said shunt controller is a field effect transistor.

16. The electronic proximity switching device according to claim 15, wherein said field effect transistor comprises an n-channel enhancement MOS-FET.

17. The electronic proximity switching device according to claim 1, wherein said actuator of said shunt controller is as least one bipolar transistor.

18. The electronic proximity switching device according to claim 1, wherein said actuator of said shunt controller comprises at least one npn transistor.

19. The electronic proximity switching device according to claim 1, wherein said actuator of said shunt controller comprises a Darlington circuit of npn transistors.

20. The electronic proximity switching device according to claim 1, further comprising a control diode positioned between said switching means and the connection of said actuator to said electronic switch, said control diode being connected in the conducting direction.

21. The electronic proximity switching device according to claim 20, further comprising a relief resistor connected in series with said actuator of said shunt controller.

* * * * *